United States Patent [19]

Baggen

[11] Patent Number: 5,799,033
[45] Date of Patent: Aug. 25, 1998

[54] METHOD OF ERROR PROTECTED TRANSMISSION, METHOD OF ERROR PROTECTED RECEPTION OF DATA AND TRANSMISSION SYSTEM FOR TRANSMISSION OF DATA

[75] Inventor: Constant P.M.J. Baggen, Eindhoven, Netherlands

[73] Assignee: U.S. Philips Corporation, New York, N.Y.

[21] Appl. No.: 595,093

[22] Filed: Feb. 1, 1996

[30] Foreign Application Priority Data

| Feb. 1, 1995 | [EP] | European Pat. Off. | 95200242 |
| Mar. 3, 1995 | [EP] | European Pat. Off. | 95200520 |
| Mar. 9, 1995 | [EP] | European Pat. Off. | 95200580 |
| Mar. 16, 1995 | [EP] | European Pat. Off. | 95200642 |

[51] Int. Cl.$^6$ .................. H04L 27/30; H03M 7/00
[52] U.S. Cl. .................. 375/200; 341/81; 371/2.8
[58] Field of Search .................. 375/200, 202, 375/206; 341/81; 371/2.1, 2.2, 37.5, 44

[56] References Cited

U.S. PATENT DOCUMENTS

| 4,394,642 | 7/1983 | Currie et al. | 341/81 |
| 4,547,887 | 10/1985 | Mui | 375/200 |
| 4,559,625 | 12/1985 | Berlekamp et al. | 371/2.1 |
| 5,051,998 | 9/1991 | Murai et al. | 371/39.1 |
| 5,056,105 | 10/1991 | Darmon et al. | 375/200 |
| 5,060,221 | 10/1991 | Sato et al. | 369/59 |
| 5,151,976 | 9/1992 | Artieri | 395/516 |
| 5,392,299 | 2/1995 | Rhines et al. | 371/37.5 |
| 5,430,767 | 7/1995 | Min | 375/340 |
| 5,442,646 | 8/1995 | Chadwick et al. | 371/43 |
| 5,463,641 | 10/1995 | Dorward et al. | 371/374 |
| 5,621,764 | 4/1997 | Ushirokawa et al. | 375/317 |
| 5,627,935 | 5/1997 | Kim | 386/81 |

OTHER PUBLICATIONS

"Error–Correction Coding For Digital Communication", by G.C. Clark, Jr. et al, Plenum Press, New York, 1981, Sections 8.5 and 8.3.2, pp. 345–380.

*Primary Examiner*—Young T. Tse
*Attorney, Agent, or Firm*—Michael E. Belk

[57] ABSTRACT

Data is transmitted via a signal containing a number of simultaneously active modulated frequency channels. The data is encoded in an error protecting code. Successive data items are mapped pseudo-randomly to different frequency channels. This protects against fading which affects frequency channels that are located at periodic distances from each other. The pseudo random mapping is realized by writing the data-items into memory in one order and reading them from memory in another order. Successive signals are each modulated in this way. The memory locations vacated upon reading data items for the modulation of one signal are filled by data-items for modulating the next successive signal. This is kept up by permuting the order of the memory locations in which the data-items are written for each successive signal.

25 Claims, 2 Drawing Sheets

METHOD OF ERROR PROTECTED TRANSMISSION, METHOD OF ERROR PROTECTED RECEPTION OF DATA AND TRANSMISSION SYSTEM FOR TRANSMISSION OF DATA

TECHNICAL FIELD

The invention relates to a) a method for error protected transmission of data, b) a method for error protected reception of data, c) a transmission system for the transmission of data, and d) transmitting and receiving sections for such a system.

BACKGROUND OF THE INVENTION

A method and system of this kind is known from the book "Error correction coding for digital communications" by G. C. Clark and J. B. Cain, Plenum Press New York, 1981, sections 8.5 and 8.3.2.

The cited book describes a system which is intended to counteract jamming. This is achieved by a spread spectrum technique, which involves greatly expanding the transmit spectrum relative to the data rate. The idea is that this forces the jammer to deploy his power over a much wider bandwidth than would be necessary for an unspread spectrum.

The anti-jamming system modulates the information successively at different frequencies. As a function of time, the channel used to communicate the information "hops" from one frequency to another. To protect against the jamming of particular frequencies to which the information communication channel may hop, the information is encoded in an error correction code prior to modulation. In addition, the encoded information is interleaved: the time sequential order in which the data-items are modulated is permuted with respect to the order in which they succeed each other in the error protection code. In the prior art technique, interleaving serves to make the anti-jamming system more robust against pulses that jam all frequencies to which the information communciation channel may hop for part of the time.

The described system makes very inefficient use of the available frequencies, which forces the jammer to deploy his power over a much wider bandwidth such inefficiency is thus essential for achieving anti-jamming as described in the book by G. C. Clark and J. B. Cain.

SUMMARY OF THE INVENTION

It is an object of the invention to apply pseudo random interleaving to applications which make more efficient use of the frequencies available.

It is a further object of the invention to provide for multichannel broadcasting which is robust against degradation due to multipath transmission and which makes efficient use of the frequencies available.

The invention provides for a method for error protected transmission of data, the method including a basic cycle having the steps of a) encoding the data into a logic succession of data-items in an error correction code which is more robust against errors that are separate from each other in the logic succession than against errors that occur in a burst in the logic succession;

b) generating a signal including a number of simultaneously active, modulated frequency channels;

c) selecting for each particular data-item a particular frequency channel having a particular frequency position among the frequency channels, the particular frequency position being a pseudo random function of a logic position of that particular data-item in the logic succession;

d) modulating each frequency channel as a function of at least a respective one of the data-items, the particular frequency channel being modulated as a function of at least the particular data-item; and e) transmitting the signal.

As a result of the simultaneous transmission of information in a number of frequency channels, the frequencies available are efficiently used. The invention addresses the problem of transmission channels that may suffer from multipath transmission rather than from jamming. In the case of wireless broadcasting, for example, indirect transmission may occur in addition to direct transmission of electromagnetic radiation, for example, due to reflection of the radiation by a building. It has been found that this often leads to variations in the receivability of the various frequency channels. Moreover, it has been found that this variation is often periodic, i.e., it recurs as a function of frequency after a number of channels. The recurrent period is dependent on the receiving conditions and, generally speaking, it cannot be predicted.

The use of pseudo-random interleaving prevents multipath transmission from causing burst errors that are so long that they cannot be corrected.

One embodiment of the method according to the invention includes the steps of writing the data-items into respective memory locations in a first order of data-items, in which first order the data-items become available during encoding;

reading the data-items from the respective memory locations in a second order of data-items, in which the data-items are needed according to said pseudo-random function for modulating;

the method including performing successive versions of said basic cycle, in each of which versions the logic succession of data-items and the signal are a respective one of a series of logic successions and of a series of successively transmitted signals, respectively, said writing of the data-items being performed in each particular version in a respective third order of the memory locations, in which the memory locations become available upon reading the data-items for a directly preceding version of the basic cycle, so that said respective third order in the particular version is permuted with respect to the respective third order in the directly preceding version according to the pseudo-random function. Thus, interleaving is performed by writing data items into a memory and by subsequently reading the data items therefrom in a different order. New data is then written into memory locations vacated by reading before all other locations have been read, which makes it possible to save memory space. For monotonously ascending address series this is taught in U.S. Pat. No. 5,151,976. The invention, however, applies this operation to the writing according to a pseudo- random sequence. Despite the fact that such a pseudo-random sequence is far more complex than a monotonous series, it has been found that the use of direct writing after reading with random sequences can be used advantageously for interleaving.

In an embodiment of the method of the invention, the memory addresses are selected alternately as a monotonously ascending or descending order and as the pseudo

3 random function of that order. By using only two different series of addresses in an alternating fashion, interleaving is simplified.

In an embodiment of the invention, the addresses are calculated according to a linear congruential sequence satisfying $$X_{n+1}=(aX_n+c)\bmod M$$

n being the position of a particular data-item in the second order, $X_n$ being the address from which that particular data-item is read, M being the number of selectable memory locations, a and c being a factor and a summand for a linear congruential sequence respectively, the combination of the factor and the summand used being changed for each version of the basic cycle. The factor a and summand c for linear congruential sequences are such that c is a relative prime with respect to M, a−1 is a multiple of all-primes factors of M, and a−1 is a multiple of 4 if m is a multiple of 4. This provides a simple way of generating the addresses. In particular it has been found that, when all "a" used for different versions are such that the square of (a−1) is divisible by M, it is ensured that all orders of addresses, which are successively required to read data-item that have been written in the order of locations in which the preceding data-items have been read, can always be generated in correspondence with this formula.

The invention also relates to a method of receiving data, and to a system for applying the method and its components, to which similar measures can be applied mutatis mutandis to obtain similar advantages.

These and other aspects of the invention will be apparent from and elucidated with reference to the embodiments described hereinafter.

DETAILED DESCRIPTION

Figure 1:
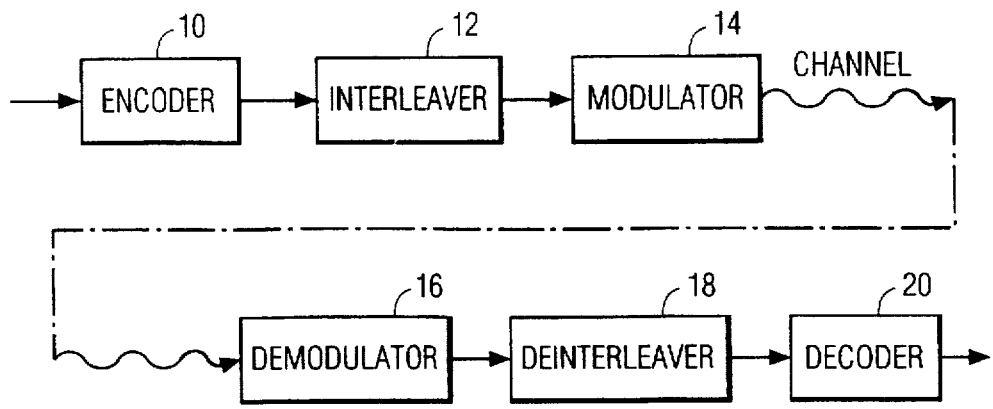
FIG. 1 shows a transmission system.

FIG. 1 shows a transmission system. It comprises a cascade connection of, successively, an encoder 10, an interleaver, 12, a modulator 14, a transmission channel, a demodulator 16, a de-interleaver 18 and a decoder 20.

During use, data is presented to an input of the encoder 10. The encoder 10 encodes this data in an error correction code. Any known error correction code, for example a convolution code, can be used for this purpose. The encoded data is composed of, for example, blocks, each of which contains a logic succession of bits.

The decoder 20 corresponds to the encoder 10 and corrects bit errors incurred during transmission from the encoder 10 to the decoder 20. The error correction code is such that bit errors which occur distributed throughout the logic succession can be readily corrected. Burst errors, where a number of successive bits in the logic succession are incorrect, can be less readily corrected when they are too long.

The modulator 14 produces a signal with a number of frequency channels which are simultaneously transmitted.

4

The bits of each block are distributed among a number of groups. Each group corresponds to a frequency channel and the information of the bits in a group is transmitted in the corresponding frequency channel. This can be realized, for example by interpreting the bits of each group as a number, by arranging these numbers in a series and making a fast Fourier transform (FFT) of the series. The result of the FFT is subsequently transmitted via the transmission channel, for example a wireless terrestrial broadcast channel. The FFT and transmission are repeated for successive blocks. This corresponds to the known orthogonal frequency division multiplexing (OFDM) technique.

The demodulator 16 corresponds to the modulator 14. The demodulator receives the various frequency channels simultaneously and reconstructs the groups of bits transmitted in a respective frequency channel. According to the OFDM technique, this is performed, for example, a) by making an inverse FFT of the signal received and b) by reconstructing the numbers, and hence the groups therefrom.

The interleaver 12 serves to ensure that bits which are directly adjacent in the logic succession are substantially always modulated in different frequency channels. The spacing of these channels (in terms of channels with intermediate frequencies) is preferably larger than zero, so that adjacent bits will enter non-adjacent channels. This serves to ensure that a disturbance of a single channel, or of a number of neighbouring channels, does not lead to burst errors in the logic succession.

The de-interleaver 18 corresponds to the interleaver 12 and performs the reverse operation, so that the logic succession is reconstructed in terms of order, i.e., except for bit errors, before being presented to the decoder 20.

The interleaver 12 places every adjacent pair of bits, which succeed one another in the logic succession, at a respective distance, amounting to a number of channels, from one another. The respective distances have different values and it is ensured that the various distances occur approximately equally frequently. As a result, the system is robust to disturbances of the transmission channel which lead to poor reception in a periodic system of frequency channels. In this context, a periodic system is to be understood to mean a system in which the poor reception recurs as a function of the frequency each time after the same number of channels.

All other pairs of bits which are so near to one another that a simultaneous error in the bits of such a pair could give rise to burst problems are also placed at a respective distance of a number of channels from one another. These respective distances preferably also have different values, and it is ensured that these different distances occur approximately equally frequently.

Figure 2:
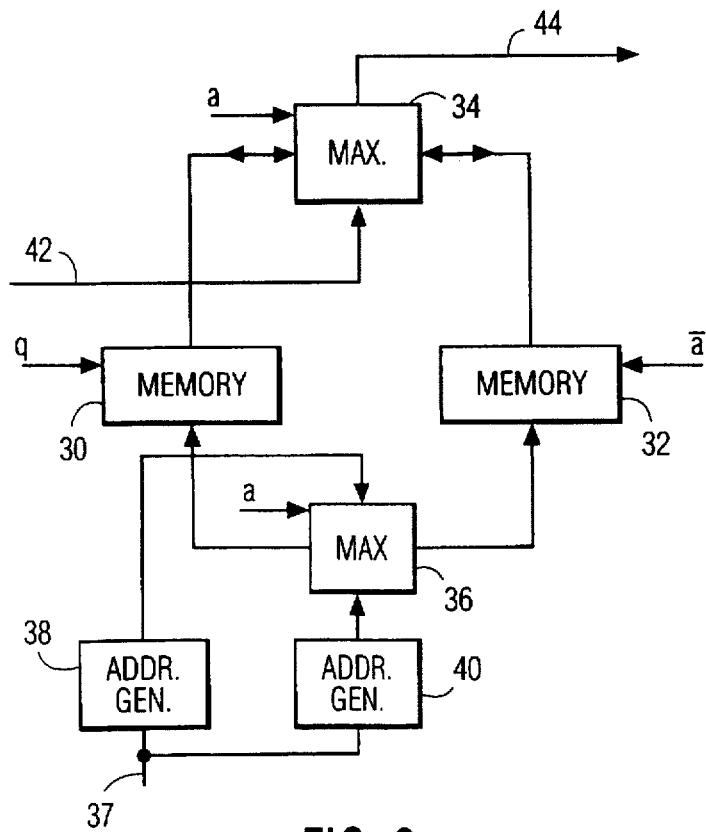
FIG. 2 shows an embodiment of an interleaver.

FIG. 2 shows an embodiment of an interleaver; this device is also suitable as a de-interleaver. The interleaver of FIG. 2 comprises a data input 42 which is coupled, via a multiplexer 34, to respective data inputs/outputs of a first and a second memory 30, 32. The data inputs/outputs of the memories 30, 32 are also coupled, via the multiplexer 34, to an output 44 of the interleaver.

The interleaver also comprises a clock input 37 coupled to clock inputs of a first and a second address generator 38, 40. The output of each of the address generators is coupled to a further multiplexer 36. The outputs of the further multiplexer 36 are coupled to a respective address input of the first and the second memory 38, 40.

During operation, the interleaver is switched between two modes. In the first mode the multiplexer 34 couples the input 42 to the data input of the first memory 30 and the output 44 to the data output of the second memory 32. Furthermore, the further multiplexer 36 couples the output of the first address generator 38 to the address input of the first memory 30 and the output of the second address generator 40 to the address input of the second memory 32. In the second mode the roles of the first and the second memory 30, 32 are reversed in comparison with the first mode.

The first address generator 38 generates a clocked first series of addresses. The various data items presented to the input 42 during successive clock cycles are written at these addresses. Data is read from the second memory 32 in a similar manner, addressed by a second series of addresses from the second address generator, and applied to the output 44. The first and the second series of addresses deviate from one another, resulting in interleaving.

The first series of addresses is, for example, a monotonously ascending series (1, 2, 3 . . . ) and the second series of addresses is a pseudo-random series, for example a series in which a respective difference exists between each pair of directly successively generated addresses; these respective differences have various values and it is ensured that the various values occur approximately equally frequently. The differences correspond to the distances between the frequency channels in which successive bits of the logic succession are arranged.

The corresponding de-interleaver has the same structure as shown in FIG. 2, with the first address generator of the de-interleaver generating the same address series as the second address generator of the interleaver, and vice versa.

The pseudo-random series can be generated by assembling the address generator 40 from a counter and a ROM, successive pseudo-random addresses being stored in successive locations in the ROM. Alternatively, use can be made of a known linear congruent series, the addresses $X_n$ for the memory 32 being obtained by way of the recursion relation $$X_{n+1}=(aX_n+c)\bmod M$$

These addresses can be obtained by multiplication and addition, without utilizing a ROM. A further alternative consists in the use of a Linear Feedback Shift Register (LFSR).

Figure 3:
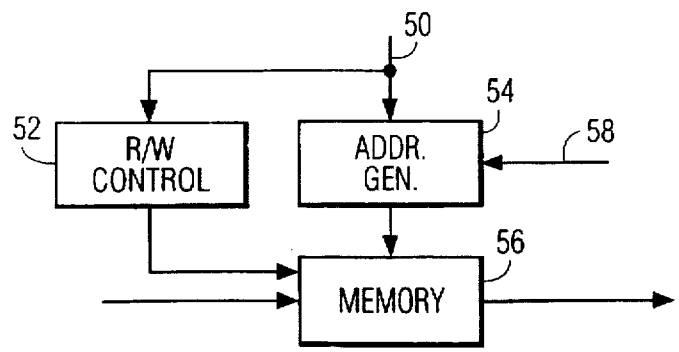
FIG. 3 shows a further embodiment of an interleaver.

FIG. 3 shows a further embodiment of an interleaver. This embodiment includes only one memory 56. The input and the output of the interleaver are coupled to a data input and a data output, respectively, of this memory 56. The interleaver also has a clock input 50, which is coupled to an address generator 54. An output of the address generator 54 is coupled to an address input of the memory 56. The clock input 50 is also coupled, via a read/write control unit 52, to a read/write control input of the memory.

The address generator 54 generates a series of addresses during operation. For each address a first data item is read from the memory 56 so as to be applied to the output; subsequently, the read/write control circuit switches the memory to the write mode and a data item originating from the input is written into the memory at the same address.

The address generator 54 each time generates such a series of addresses. Each series contains substantially the same addresses. The order in which the addresses succeed one another in directly successive series, however, differs each time. For example, alternately a pseudo-random series ($X_1, X_2, X_3 \ldots X_n$) and a normal monotonously ascending series (1, 2, 3 . . . N) can be taken. This results in interleaving with a substantially uniform distribution of the differences between successive addresses.

By using only two different series of addresses in an alternating fashion, de-interleaving is simplified (same two series, so that each time the data items are written in the de-interleaver in memory locations which correspond to the locations wherefrom they have been read in the interleaver). However, this approach has the drawback that the method of interleaving is often repeated, so that the transmission system becomes susceptible to systematic disturbances.

Therefore, as an attractive alternative, it is possible to use more than two different series and to repeat the pattern of series of addresses only after more than two complete series. To this end, for broadcast applications, a linear congruential sequence is preferably used at the receiving side in the de-interleaver, because such a sequence can be simply implemented. At the transmission side, for example, an interleaver comprising a ROM is then used, the ROM containing the inverse permutation of what the de-interleaver contains at the receiving side. Given the permutation realized by the interleaver, this inverse permutation can be calculated, for example numerically. If a recurrent pattern of mutually different series of addresses is used in the de-interleaver, including a monotonously ascending series (1, 2, 3), this inverse permutation requires only a limited amount of space in the memory ROM.

When different address series are used, a synchronization signal is desirable between the receiving side and the transmission side, so that the de-interleaver can tart the pattern of series of addresses in the correct phase for serving as the inverse of he interleaver. For this purpose use is preferably made of a transmitted synchronization signal, which also serves to mark header information for the further processing of the encoded symbol.

Figure 4:
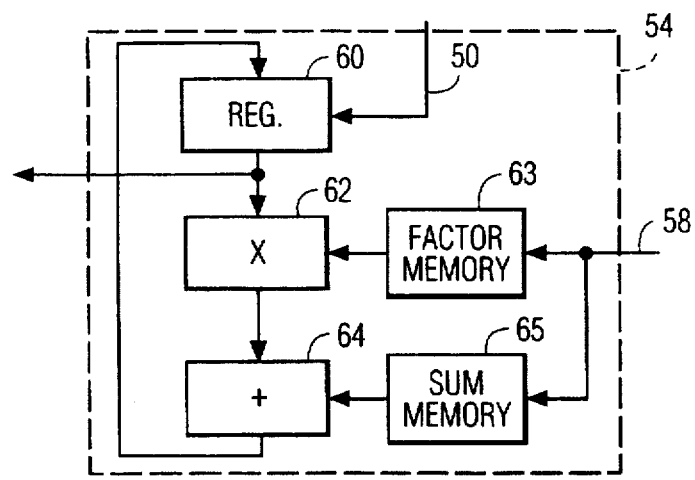
FIG. 4 shows an embodiment of an address generator.

FIG. 4 shows an embodiment of an address generator 54 for use in an interleaver as shown in, for example FIG. 3. The address generator 54 comprises a register 60, an output of which is coupled to the output of the address generator and to a first multiplicand multiplier 62. The output of the multiplier 62 is coupled to a first summand input of an adder 64. The output of the adder 64 is coupled to an input of the register 60. The address generator comprises a factor memory 63 and a summand memory 65 which are coupled, by way of an output, to a second multiplicand input of the multiplier 62 and to a second summand input of the adder 64, respectively.

During operation the register 60 contains the address $X_n$ for the memory. Using the multiplier 62 and the adder 64, the next address is calculated in conformity with the formula $$X_{n+1}=(aX_n+c)\bmod M$$

where M is the length of the address series. The factor "a" and the summand "c" are derived from the factor memory 63 and the summand memory 65, respectively. Between successive series the memories 63, 65 receive signals, by which another factor and/or summand is applied to the multiplier and the adder, so that subsequently a different series is generated. In one of the series, for example a=1 and c=1, the result is a monotonously ascending series. In the other series a is then unequal to 1 and is chosen, in a manner which is known in the art, so as to generate a pseudo-random sequence (c relative prime with respect to M, a−1 is a multiple of p for all primes p sharing M, e.g., if M=45= 3*3*5 then a−1 must be a multiple of both 3 and 5, and a−1 is a multiple of 4 if M is a multiple of 4).

By storing a number of different usable values of a and c, a corresponding number of different series of addresses can be generated.

Preferably, the "a" values are selected only such that a−1 squared is divisible by "M", i.e. such that a−1 contains each prime factor of m at least half as many times as "M". For example, when M=675=3*3*3*5*5, a−1 could be 45=3*3*5. In general, large M values with several prime factors are required, e.g., of the M values of 1 to 20 only M=8, 9, 12, 16, 18 qualify. It can be proven that, when only "a" values having the property that the square of a−1 is divisible by M are used for generating the addresses, any pseudo random permutation of the bits described by the formula $X_{n+1}=(aX_n+c) \bmod M$ can be realized with an "a" value that also satisfies this condition. Also it has been found that both the addresses for interleaving and deinterleaving can then be realized with such pseudo random permutations in that case. Hence, no address ROM is needed. It has been found that this is true only when the square of a−1 is divisible by M. In this case the addresses need not be calculated by actually calulating the formula $X_{n+1}=(aX_n+c) \bmod M$. In stead, one may use $X_{n+1}=X_n+v_n \bmod m$; $v_n+d \bmod m$, with $d=c(a-1)$, and $v_0$ initialized to $(a-1)X_0+c$. For example, when M=100(=2*2*5*5), "a" may be chosen as 21 (a−1=4*5) and c=1).

When the modulus M with which the multiplier and adder operate is made adjustable, the interleaver/de-interleaver can be simply switched between different block lengths.

Evidently, the invention is not restricted to the embodiments given. For example, instead of operating with bits it is also possible to operate with larger symbols, for as long as the error correction code is capable of correcting random and isolated errors in these symbols better than random errors in the form of a burst.

Furthermore, the logic succession of bits produced by the encoder is not necessarily a temporal succession. Bits are "logically successive" if simultaneous errors in these bits can be corrected less readily than simultaneous errors in "non-logically successive" bits.

The inner frequency interleaving is a pseudo-random bit interleaving. The interleaving is on a block basis, i.e., the bits in each OFDM symbol are permuted in a fixed way such that bursts are randomized. However, bits of a given OFDM symbol are not mixed with bits originating from any other OFDM symbol.

In a practical example, an OFDM symbol consists of N useful subcarriers, where N equals 6361 or 5937, that each contain 2, 4 or 6 bits of information. The task of the interleaver is to decorrelate the bits at the input of a Viterbi detector.

The (de)interleaver consists of a memory (RAM) having the size of 8 times 8192 bits and an addressing unit. The addressing unit generates a 16 bit address that can be distinguished in 3 least significant bits and 13 most significant bits. The 13 most significant bits determine a particular subchannel, while the 3 least significant bits determine which bit from a given subchannel. Each time as the RAM is addressed, the contents are read and put forward to the downstreamdecoder and the next bit at the input is written in the current location. At each cycle, all relevant locations must be addressed. The three least significant bits periodically go through relevant states, which are dependent on the number of bits per symbol, while the 13 most significant bits are generated by an algorithm producing all relevant addresses in a special sequence.

Since 6361 is prime and 5937 is divisible by three, the least significant bit addresses can be generated in pairs, an algorithm is defined that works for 2 bits of information per subcarrier and this algorithm is used 1, 2 or 3 times dependent on the number of bits per symbol, each time with a different fixed offset on the least significant bits. In this way it is assured that all bits will be addressed under all circumstances before the addressing unit will be in the same state.

One way of producing a periodic interleaver would be to generate the consecutive addresses $x_{t,n}$, $0 \leq n < N$ of the 13 most significant bits in the OFDM symbol at time t according to:

$$x_{t,n+1}=x_{t,n}+c_t \bmod N \quad (1)$$

with $x_{t,0}=0 \forall t$ and $GCD(c_t,N)=1$. The increment $c_t$ depends on the time t. For a periodic interleaver, we can choose $c_t=c_{t-1}*c_0 \bmod N$, where $c_0$ is a judiciously chosen initial increment that corresponds to the actually realized interleave depth.

In summary, the invention relates to a transmission system which comprises an encoder, an interleaver, a modulator, a transmission channel a demodulator, a deinterleaver and a decoder. The encoder is used for encoding a data block in an error correction code containing a logic succession of data items. The decoder is used for correcting errors in the transmission between the encoder and the decoder. The error correction code is more robust to errors which occur simultaneously and in an isolated fashion in the logic succession than to errors which occur simultaneously and in the form of a burst therein. The modulator is used for generating a signal which comprises a number of frequency channels to be transmitted simultaneously, each of the frequency channels corresponding to a group which comprises at least one of the data items and is modulated in the respective channel. The transmission channel is located between the modulator and the demodulator. The demodulator reconstructs the groups and applies the groups to the decoder. The interleaver distributes the data items between the groups and introduces a pseudo-random relationship between the logic succession and the distribution between the successive frequency channels. The de-interleaver reconstructs the logic succession from the groups reconstructed by the demodulator, before presentation to the decoder.

This transmission system can be improved when the interleaver and/or the deinterleaver realise the distribution by way of a non-monotonous linear congruential sequence.

The transmission system can be further improved when the interleaver and/or the de-interleaver are provided with a memory for the data items and with write and read means, the write means writing each time a data item in a location of the memory which has just been read before the read means read a data item from a next location of the memory, and in which an order of locations in which the logic succession is written differs for successive logic successions.

A further improvement concerns a transmission system in which the orders are periodically recurrent with a period of at least two blocks in which one monotonously ascending or descending order occurs. Also the write and/or read means may comprise an address generator which is arranged to form a linear congruential sequence with a factor and a summand, and also arranged to replace the factor and/or the summand from one block to another.

Thus information can be transmitted by the following steps:

a) encoding the data in an error correction code;

b) interleaving the data according to a pseudo-random sequence;

c) modulating the data in a series of frequency channels, data items which cannot be corrected together being arranged in separate frequency channels by interleaving;

d) demodulating the data;

e) de-interleaving the data;

f) decoding the data.

Figure 5:
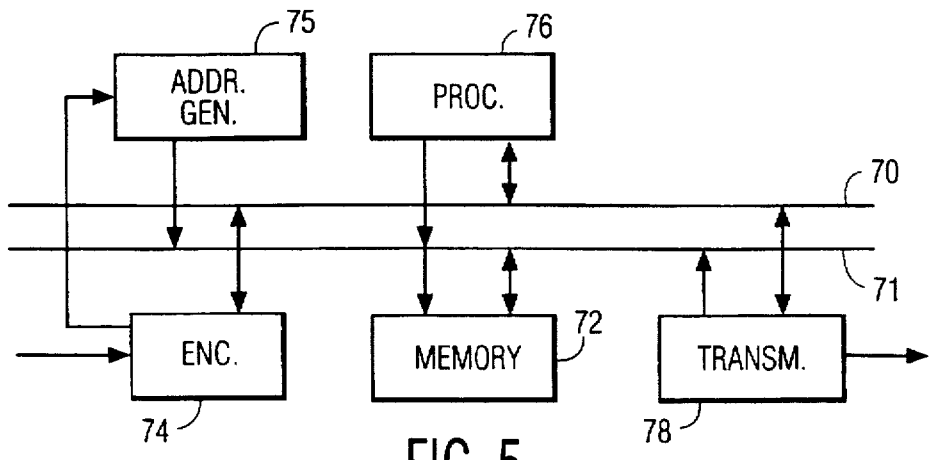
FIG. 5 shows an embodiment of the transmitting section according to the invention

FIG. 5 shows an embodiment of the transmitting section according to the invention. The transmitting section contains a data bus 70 and an address bus 71 connecting a memory 72, a processor 76 and a transmitter 78. An encoder 74 is coupled to the data bus 70. The encoder 74 is coupled to the address bus 71 via an address generation unit 75.

In operation, the encoder 74 receives the data block and encodes it as a succession of bits. Each successive bit is fed to the data bus 70, and the presence of the bit is signalled to the address generator 75. The address generator 75 generates a respective address for each successive bit according to the pseudo random sequence. The address indicates both a word location in the memory 72 and a bit location within the word location. The word location corresponds to the group to which the bit is assigned, and the bit location corresponds to the location of the bit within the group. The address generator 75 ensures that bits which are logically adjacent are substantially always stored in different word locations. The spacing of these word locations is preferably larger than zero, so that logically adjacent bits will enter non-adjacent word locations.

The address is applied to the address bus and the bit is stored in the memory 72 at a location that corresponds to the address generated for it by the address generator 75. When the entire data block has thus been encoded in the error protecting code, and stored in the memory 72, the processor 76 is started. The processor 76 computes the FFT of the words stored in memory 72. For this purpose, it reads the words each time as they are needed for the FFT algorithm. For this purpose a known FFT algorithm can be used, which addresses the word locations of the memory 72 in a normal way, i.e. without requiring knowledge of the interleaving process. Because the bits which are logically adjacent have substantially always been stored in different word locations, these adjacent bits are modulated in different frequency channels as a result of the FFT. This result is subsequently read by the transmitter 78 and transmitted via the transmission channel (not shown).

A structure similar to that of FIG. 5 can be used for the receiving section, with a receiver replacing the transmitter 78 and a decoder replacing encoder 74. In this case the receiver writes words into memory 72 and the processor 76 performs an FFT on the words. Address generator 75 effects the pseudo random interleaving, issuing successive word/bit address pairs to read out the results of the FFT bit by bit for error correction by the decoder.

The foregoing merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method for error protected transmission of data, the method including a basic cycle comprising the steps of:
    encoding the data into a logic succession of data-items in an error correction code which is more robust against errors that are separate from each other in the logic succession than against errors that occur in a burst in the logic succession;
    generating a signal comprising a number of simultaneously active, modulated frequency channels;
    selecting for each particular data-item a particular frequency channel having a particular frequency position among the frequency channels, the particular frequency position being a pseudo random function of a logic position of that particular data-item in the logic succession;
    modulating each frequency channel dependent upon at least a respective one of the data-items, the particular frequency channel being modulated dependent upon at least the particular data-item; and
    transmitting the signal which comprises data transmitted simultaneously in a number of frequency channels.

2. A method according to claim 1, further comprising the steps of:
    writing the data-items into respective memory locations in a first order of data-items, in which first order the data-items become available during encoding; and
    reading the data-items from said respective memory locations in a second order of data-items, in which the second order of data-items are needed according to said pseudorandom function for modulating;
    wherein successive versions of said basic cycle are performed, in each of which versions the logic succession of data-items and the signal are a respective one of a series of logic successions and of a series of successively transmitted signals, respectively, said writing of the data-items being performed in each particular version in a respective third order of the memory locations, in which the memory locations become available upon reading the data-items for a directly preceding version of the basic cycle, whereby said respective third order in the particular version is permuted with respect to the respective third order in the directly preceding version according to the pseudorandom function.

3. A method according to claim 2, wherein said third order of memory locations periodically recur each time after a period containing a number of versions of the basic cycle, the period containing at least two versions of the basic cycle.

4. A method according to claim 3, wherein in each period one respective third order of locations has monotonously increasing or decreasing addresses of memory locations.

5. A method according to claim 4, wherein said period is composed of exactly two versions of the basic cycle, the respective third order having alternately monotonously ascending or descending addresses of memory locations and addresses permuted according to the pseudo random function.

6. A method according to claim 2, in which the addresses of the memory locations are calculated according to a linear congruential sequence satisfying $$X_{n+1} = (aX_n + c) \bmod M$$

n being the position of a particular data-item in the second order, $X_n$ being the address from which that particular data-item is read, M being the number of selectable memory locations, a and c being a factor and a summand for the linear congruential sequence respectively, the combination of the factor and the summand used being changed for each version of the basic cycle.

7. A method according to claim 1, wherein the pseudo random function corresponds to a non-monotonous linear congruential sequence.

8. A method for error protected reception of data, the method including a basic cycle comprising the steps of:
    receiving a signal comprising a number of simultaneously active, modulated frequency channels, each having been modulated dependent upon at least one own particular data-item;
    demodulating the particular data items from the frequency channels;
    selecting for each particular data-item a logic position in a logic succession, the logic position being an inverse pseudo-random function of a particular frequency position among the frequency channels of a particular frequency channel from which the particular data-item was demodulated; and decoding the data from the logic succession of data-items according to an error correction code which is more robust against errors that are separate from each other in the logic succession than against errors that occur in a burst in the logic succession.

9. A method according to claim 8, further comprising the steps of writing the data-items into respective memory locations in a first order of data-items, in which first order the data-items become available from demodulating;

reading the data-items from the respective memory locations in a second order of data-items, in which the second order of data-items are needed according to said inverse pseudo-random function for decoding;

wherein successive versions of said basic cycle are performed, in each of which versions the logic succession of data-items and the signal are a respective one of a series of logic successions and of a series of successively transmitted signals, respectively, said writing of the data-items being performed in each particular version in a respective third order of the memory locations, in which the memory locations become available upon reading the data-items for a directly preceding version of the basic cycle, whereby said respective third order in the particular version is permuted with respect to the respective third order in the directly preceding version according to the inverse pseudo-random function.

10. A method according to claim 9, wherein said third order of memory locations periodically recur each time after a period containing a number of versions of the basic cycle, the period containing at least two versions of the basic cycle.

11. A method according to claim 10, wherein in each period one respective third order of locations has monotonously increasing or decreasing addresses of memory locations.

12. A method according to claim 11, wherein said period is composed of exactly two versions of the basic cycle, the respective third order having alternately monotonously ascending or descending addresses of memory locations and addresses permuted according to the inverse pseudo random function.

13. A method according to claim 8, wherein the inverse pseudo random function corresponds to a non-monotonous linear congruential sequence.

14. A method according to claim 9 in which the addresses of the memory locations are calculated according to a linear congruential sequence satisfying $X_{n+1}=(aX_n+c) \bmod M$ n being the position of a particular data-item in the second order, $X_n$ being the address from which that particular data-item is read, M being the number of selectable memory locations, a and c being a factor and a summand for the linear congruential sequence respectively, the combination of the factor and the summand used being changed for each version of the basic cycle.

15. A transmission system for error protected transmission of data, the transmission system comprising:
a transmission channel;
a transmitting section including
an encoder for encoding the data into a logic succession of data-items in an error correction code which is more robust against errors that are separate from each other in the logic succession than against errors that occur in a burst in the logic succession;

a signal generator for generating a signal comprising a number of simultaneously active, modulated frequency channels;

selecting means for selecting for each particular data-item a particular frequency channel having a particular frequency position among the frequency channels, the particular frequency position being a pseudo random function of a logic position of that particular data-item in the logic succession;

a modulator for modulating each frequency channel dependent upon at least a respective one of the data-items, the particular data-item being modulated in the particular frequency channel;

a transmitter for transmitting the signal via the transmission channel; and a receiving section including
a reception input for receiving the signal from the transmission channel;
a demodulator for demodulating the data-items from the frequency channels in the signal;
inverse selecting means for selecting the logic position of the particular data-item as an inverse pseudo-random function of the particular frequency position of the particular frequency channel from which the particular data-item was demodulated; and
a decoder for decoding data from the logic succession of data-items according to the error correction code.

16. A transmission system according to claim 15, wherein the pseudo random function corresponds to a non-monotonous linear congruential sequence.

17. A transmission system according to claim 15 wherein the transmitting section performs successive versions of a basic cycle, in each of which versions the logic succession of data-items and the signal are a respective one of a series of logic successions and of a series of successively transmitted signals, respectively, the selecting means comprising:
a memory;
write means for writing the data-items from the logic succession into the memory;
read means for reading the data-items from the memory and for applying the data-items read to the modulator; and
address generating means for generating addresses for both reading and writing, said addresses being generated in a respective order of addresses for each particular version, the order in the particular version being permuted with respect to the respective order in a directly preceding version according to the pseudorandom function for the version, the read means reading the data-items in the particular version according to the order generated for that particular version, the write means writing the data-items in the particular version according to the addresses generated for the directly preceding version of the particular version.

18. A transmission system according to claim 17 wherein said respective order of addresses periodically recurs each time after a period of at least two versions of the basic cycle, one monotonously ascending or descending order of addresses occurring in each period.

19. A transmission system according to claim 18 wherein period is composed of exactly two versions, the respective order being alternately a monotonously ascending or descending order of the stage in the cycle and the pseudo random function.

20. A transmission system according to claim 15 wherein the receiving section performs successive versions of a basic cycle, in each of which versions the logic succession of data-items and the signal are a respective one of a series of logic successions and of a series of successively received signals, respectively, the inverse selecting means further comprising:

a memory;

write means for writing the data-items received from the demodulator into the memory;

read means for reading the data-items from the memory and for applying the data-items read to the decoder; and address generating means for generating addresses for both reading and writing, said addresses being generated in a respective order of addresses for each particular version, the order in the particular version being permuted with respect to the respective order in a directly preceding version according to the inverse pseudo-random function for the version, the read means reading the data-items in the particular version according to the order generated for that particular version, the write means writing the data-items in the particular version according to the addresses generated for the directly preceding version of the particular version.

21. A transmission system according to claim 20, wherein said respective order of addresses periodically recurs each time after a period of at least two versions of the basic cycle, one monotonously ascending or descending order of addresses occurring in each period.

22. A transmission system according to claim 21 wherein said period is composed of exactly two versions, the respective order being alternately a monotonously ascending or descending order of the stage in the cycle and the inverse pseudo random function.

23. A transmitting apparatus for pseudo random interleaving of digital data comprising:

an encoder for encoding the digital data into a logic sequence of dataitems in an error correction code, means for generating a signal comprising a number of simultaneously active, modulated frequency channels, means coupled to an output of the encoder for directing successive data items to respective different frequency channels as a pseudo random function, a modulator coupled to an output of said generating means for modulating each frequency channel dependent upon respective ones of the data-items, and a transmitter for transmitting the signal as a plurality of data items transmitted simultaneously in a plurality of said frequency channels.

24. The transmitting apparatus as claimed in claim 23 wherein said directing means comprises:

a single memory for temporary storage of said data-items, means for writing data items from the encoder into memory locations in one order, means for reading the data items from said memory locations of said memory in another order and applying the read out data-items to the modulator, and means for generating addresses for both reading from and writing into the memory such that the data items are written into the single memory in said one order and are read out from the single memory in said another order according to the pseudo random function.

25. The transmitting apparatus as claimed in claim 23 wherein said directing means comprises:

a single memory for temporary storage of said data-items, means for generating addresses for both reading from and writing into the memory such that the data items are written into the single memory in one order and are read out from the single memory in another order according to the pseudo random function, and means for reading the data-items from memory locations of the single memory for the modulation of one signal, and means for writing data items for modulating the next successive signal into the memory locations vacated by the data items read out from the single memory for the modulation of the one signal.

* * * * *